United States Patent
Igoshi (10) Patent No.: US 11,990,393 B2
(45) Date of Patent: May 21, 2024

(54) SEMICONDUCTOR DEVICE INCLUDING RESIN WITH A FILLER FOR ENCAPSULATING BRIDGE MEMBER CONNECTED TO A SUBSTRATE

(71) Applicant: DENSO CORPORATION, Kariya (JP)

(72) Inventor: Tarou Igoshi, Kariya (JP)

(73) Assignee: DENSO CORPORATION, Kariya (JP)

( * ) Notice: Subject to any disclaimer, the term of this patent is extended or adjusted under 35 U.S.C. 154(b) by 266 days.

(21) Appl. No.: 17/557,165

(22) Filed: Dec. 21, 2021

(65) Prior Publication Data

US 2022/0115307 A1    Apr. 14, 2022

Related U.S. Application Data (63) Continuation of application No. PCT/JP2020/021510, filed on Jun. 1, 2020.

(30) Foreign Application Priority Data

Jul. 10, 2019    (JP) ................. 2019-128732

(51) Int. Cl.
   *H01L 23/495*    (2006.01)
   *H01L 23/00*    (2006.01)

(52) U.S. Cl.
   CPC ........ *H01L 23/49568* (2013.01); *H01L 24/37* (2013.01); *H01L 24/38* (2013.01);
   (Continued)

(58) Field of Classification Search
   CPC ......... H01L 23/49568; H01L 2924/181; H01L 24/37; H01L 24/38; H01L 24/40;
   (Continued)

(56) References Cited

U.S. PATENT DOCUMENTS

2007/0090545 A1* 4/2007 Condie ................ H01L 23/295
                                                    257/E23.092
2008/0265386 A1* 10/2008 Muto .................... H01L 24/78
                                                    257/676
(Continued)

FOREIGN PATENT DOCUMENTS

JP    2012069640 A  *  4/2012  ....... H01L 23/49524
JP    2015072942 A  *  4/2015  ....... H01L 23/49524
(Continued)

OTHER PUBLICATIONS

U.S. Appl. No. 17/557,138, filed Dec. 21, 2021, Fukatsu et al.

*Primary Examiner* — Alonzo Chambliss
(74) *Attorney, Agent, or Firm* — POSZ LAW GROUP, PLC (57) ABSTRACT

A semiconductor device includes a semiconductor element, a lead frame, a bridge member, and a sealing resin. The semiconductor element has first and second surfaces opposite from each other, and has first and second electrodes respectively exposed on the first and second surfaces. The lead frame includes a mounting portion and a non-mounting portion divided from the mounting portion. The mounting portion has a mounting surface to which the semiconductor element is mounted and the first electrode is electrically connected, and an opposite surface opposite from the mounting surface. The bridge member electrically connects the second electrode and the non-mounting portion. The sealing resin has electric insulation, has a thermal conductivity of 2.2 W or more, and covers the semiconductor element, the lead frame, and the bridge member in a state where the opposite surface of the mounting portion is exposed from the sealing resin.

1 Claim, 5 Drawing Sheets

(52) U.S. Cl.
CPC .............. *H01L 24/40* (2013.01); *H01L 24/41* (2013.01); *H01L 24/84* (2013.01); *H01L 2224/37* (2013.01); *H01L 2224/40* (2013.01); *H01L 2924/181* (2013.01)

(58) Field of Classification Search
CPC ..... H01L 24/41; H01L 24/84; H01L 2224/37; H01L 2224/40
See application file for complete search history.

(56) References Cited

U.S. PATENT DOCUMENTS

| | | | |
|---|---|---|---|
| 2013/0009300 A1* | 1/2013 | Yato | ........................ H01L 24/49 257/676 |
| 2014/0103510 A1* | 4/2014 | Andou | .............. H01L 23/49551 257/676 |
| 2015/0115423 A1 | 4/2015 | Yamashita | |
| 2015/0325502 A1* | 11/2015 | Andou | .................... H01L 24/89 438/123 |
| 2019/0057928 A1 | 2/2019 | Kawashima et al. | |
| 2019/0181078 A1* | 6/2019 | Yamamoto | ........ H01L 23/49575 |
| 2022/0115302 A1* | 4/2022 | Fukatsu | .................. H02M 1/08 |

FOREIGN PATENT DOCUMENTS

| | | | | |
|---|---|---|---|---|
| JP | 2015-138843 | A | | 7/2015 |
| JP | 2016167480 | A | | 9/2016 |
| JP | 2019-075523 | A | | 5/2019 |
| JP | 2019192751 | A | * 10/2019 | ......... H01L 23/3107 |

* cited by examiner

SEMICONDUCTOR DEVICE INCLUDING RESIN WITH A FILLER FOR ENCAPSULATING BRIDGE MEMBER CONNECTED TO A SUBSTRATE

CROSS REFERENCE TO RELATED APPLICATIONS

The present application is a continuation application of International Patent Application No. PCT/JP2020/021510 filed on Jun. 1, 2020, which designated the U.S. and claims the benefit of priority from Japanese Patent Application No. 2019-128732 filed on Jul. 10, 2019. The entire disclosures of all of the above applications are incorporated herein by reference.

TECHNICAL FIELD

The present disclosure relates to a semiconductor device.

BACKGROUND

There has been known a semiconductor device including a semiconductor element, a heat sink electrically and thermally connected to the semiconductor element, and a sealing resin covering the semiconductor element and the heat sink in a state where a surface of the heat sink opposite from the semiconductor element is exposed from the sealing resin.

SUMMARY

The present disclosure provides a semiconductor device including a semiconductor element, a lead frame, a bridge member, and a sealing resin. The semiconductor element has first and second surfaces opposite from each other, and has first and second electrodes respectively exposed on the first and second surfaces. The lead frame includes a mounting portion and a non-mounting portion divided from the mounting portion. The mounting portion has a mounting surface on which the semiconductor element is mounted and the first electrode is electrically connected, and an opposite surface opposite from the mounting surface. The bridge member electrically connects the second electrode and the non-mounting portion. The sealing resin has electric insulation, has a thermal conductivity of 2.2 W or more, and covers the semiconductor element, the lead frame, and the bridge member in a state where the opposite surface of the mounting portion is exposed from the sealing resin.

BRIEF DESCRIPTION OF DRAWINGS

Objects, features and advantages of the present disclosure will become apparent from the following detailed description made with reference to the accompanying drawings. In the drawings.

DETAILED DESCRIPTION

A semiconductor device according to an example includes a heat-generating element, a terminal and a first heat sink electrically and thermally connected to one surface of the heat-generating element, a second heat sink electrically and thermally connected to the other surface of the heat-generating element, and a sealing resin body that seals these components. The first heat sink has a facing surface that faces the terminal and an opposite surface that is opposite from the facing surface and is exposed from the sealing resin body. The second heat sink has a facing surface that faces the heat-generating element and an opposite surface that is opposite from the facing surface and is exposed from the sealing resin body.

In the semiconductor device described above, the opposite surfaces of the first heat sink and the second heat sink are exposed from the sealing resin body as heat dissipation surfaces. Therefore, the semiconductor device needs to be further provided with an insulating member such as a gel in order to secure electric insulation.

A semiconductor device according to an aspect of the present disclosure includes a semiconductor element, a lead frame, a bridge member, and a sealing resin. The semiconductor element has a first surface and a second surface opposite from each other, and has a first electrode exposed on the first surface and a second electrode disposed on the second surface. The lead frame includes a mounting portion and a non-mounting portion divided from the mounting portion. The mounting portion has a mounting surface on which the semiconductor element is mounted and the first electrode is electrically connected and an opposite surface opposite from the mounting surface. The bridge member has conductivity and electrically connects the second electrode and the non-mounting portion. The sealing resin has electric insulation, has a thermal conductivity of 2.2 W or more, and covers the semiconductor element, the lead frame, and the bridge member in a state where the opposite surface of the mounting portion is exposed from the sealing resin.

In the semiconductor device according to the aspect, since the bridge member is covered with the sealing resin without being exposed, electric insulation can be ensured. Further, in the semiconductor device according to the aspect, since the thermal conductivity of the sealing resin is 2.2 W or more, heat dissipation can be ensured.

Hereinafter, multiple embodiments of the present disclosure will be described with reference to the drawings. In each embodiment, portions corresponding to those described in the preceding embodiment are denoted by the same reference numerals, and redundant descriptions will be omitted in some cases. In each embodiment, in a case where only a part of the configuration is described, another preceding embodiment can be referenced to and applied to the other parts of the configuration. Hereinafter, three directions perpendicular to each other are denoted as an X direction, a Y direction, and a Z direction.

Figure 1:
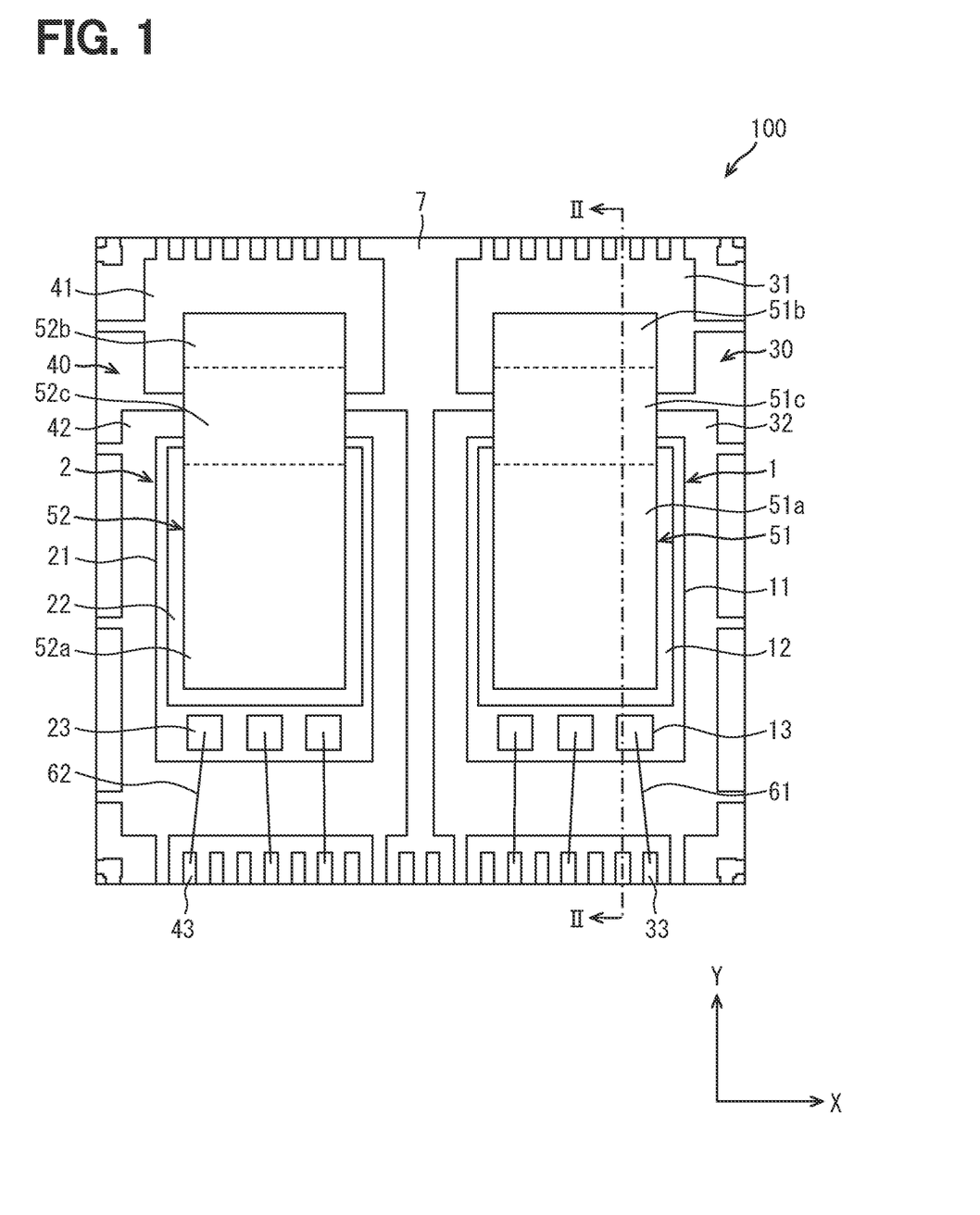
FIG. 1 is a plan view showing a schematic configuration of a semiconductor device according to an embodiment.
Figure 2:
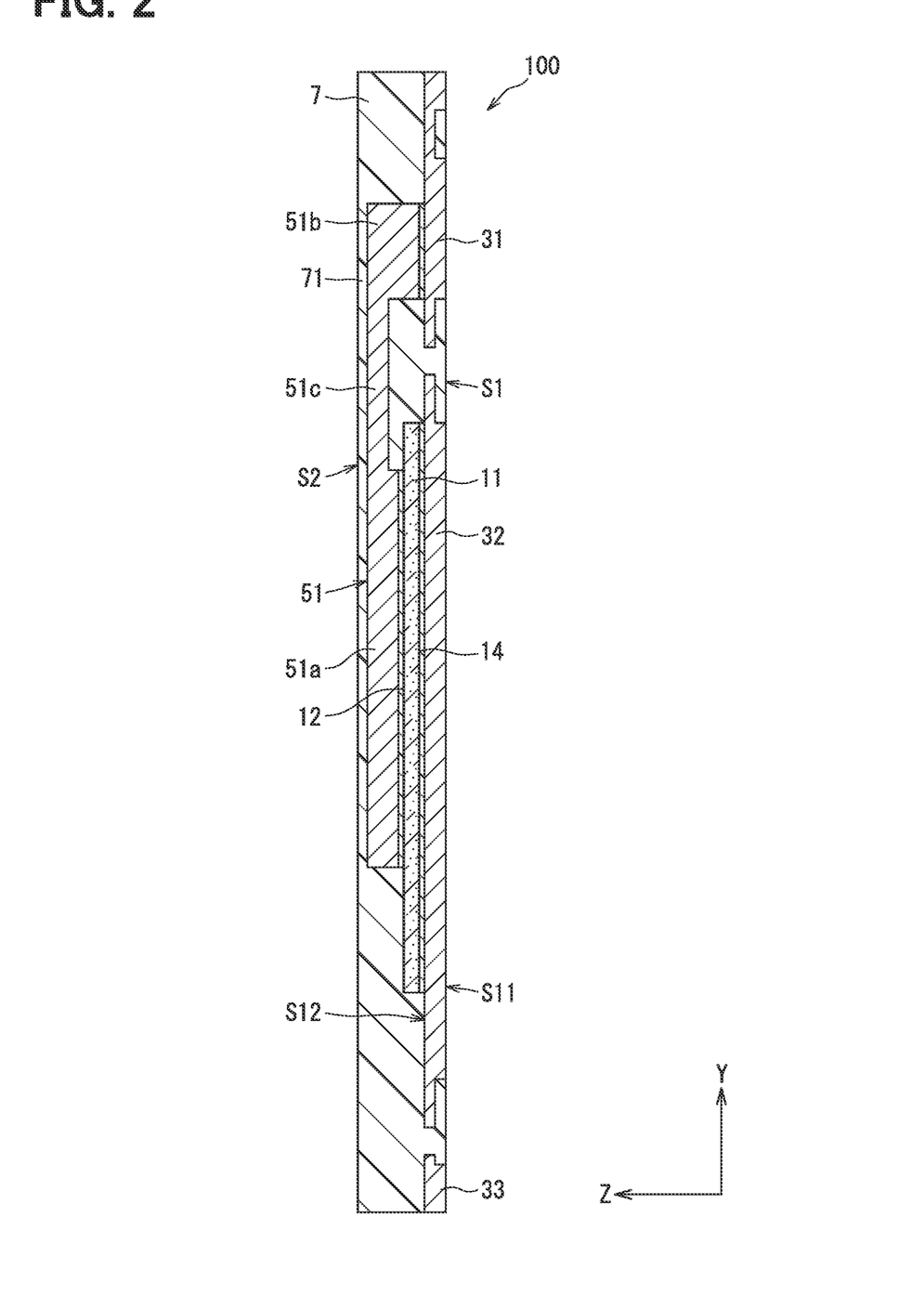
FIG. 2 is a cross-sectional view of the semiconductor device taken along line II-II in FIG. 1.

A semiconductor device 100 according to an embodiment of the present disclosure will be described with reference to FIGS. 1, 2, and 3. As shown in FIGS. 1 and 2, the semiconductor device 100 includes two semiconductor elements 1 and 2, two lead frames 30 and 40, two clips 51 and 52, and a sealing resin 7. The present embodiment adopts the semiconductor device 100 including two semiconductor elements 1 and 2. Along with this, the semiconductor device 100 includes two lead frames 30 and 40 and two clips 51 and 52. Further, the semiconductor device 100 includes two wires 61 and 62.

However, the present disclosure is not limited to this example. The semiconductor device 100 needs to include at least one semiconductor element, the same number of lead frames as the number of semiconductor elements and the same number of clips as the number of semiconductor elements.

In FIG. 1, a part of the sealing resin 7 is omitted in order to simplify the drawing and make each component easy to understand. That is, in FIG. 1, the portion of the sealing resin 7 that covers the two semiconductor elements 1 and 2, the two lead frames 30 and 40, the two clips 51 and 52, and the two wires 61 and 62 is omitted.

As an example, a metal oxide film semiconductor field effect transistor (MOSFET) is adopted as each of the semiconductor elements 1 and 2. However, the present disclosure is not limited to this example, and an insulated gate bipolar transistor (IGBT) or the like can also be adopted as each of the semiconductor elements 1 and 2. As another example, a reverse conduction (RC)-IGBT in which an IGBT and a diode are integrated can also be adopted as an each of the semiconductor elements 1 and 2. Further, as each of the semiconductor elements 1 and 2, for example, a semiconductor element having Si as a main component or a semiconductor element having SiC as a main component can be adopted.

The first semiconductor element 1 includes a first substrate 11 having a first surface and a second surface opposite from each other, a first drain electrode 14 exposed on the first surface of the first substrate 11, and a first source electrode 12 and a first gate electrode 13 exposed on the second surface of the first substrate 11. The first drain electrode 14 is formed on substantially the entire area of the first surface of the first substrate 11. On the other hand, the first source electrode 12 and the first gate electrode 13 are partially formed on the second surface of the first substrate 11.

The first substrate 11 has, for example, a rectangular shape in an XY plane and has a thickness in the Z direction. In the present embodiment, as an example, the first substrate in which the Y direction is a longitudinal direction and the X direction is a lateral direction is adopted.

The first semiconductor element 1 may be formed with a temperature sensor, a current sensor, or the like. In this case, in the semiconductor element 1, a pad electrically connected to the temperature sensor or the current sensor is formed on the same surface as the first source electrode 12 and the first gate electrode 13.

The second semiconductor element 2 includes a second substrate 21 having a first surface and a second surface opposite from each other, a second drain electrode exposed on the first surface of the second substrate 21, a second source electrode 22 and a second gate electrode 23 exposed on the second surface of the second substrate 21. The second semiconductor element 2 has a structure similar to the first semiconductor element 1. Therefore, regarding the second semiconductor element 2, the description of the first semiconductor element 1 can be referred to.

The first semiconductor element 1 and the second semiconductor element 2 correspond to semiconductor elements. The first drain electrode 14 and the second drain correspond to first electrodes. The first source electrode 12 and the second source electrode 22 correspond to second electrodes.

The first read frame 30 has a first source terminal 31, a first drain terminal 32, and a first signal terminal 33. The first lead frame 30 may contain a conductive material as a main component. The conductive material is a metallic material such as Cu, Fe, or an alloy thereof. The first source terminal 31, the first drain terminal 32, and the first signal terminal 33 are separated from each other.

The first drain terminal 32 has a mounting surface S12 on which the first semiconductor element 1 is mounted. More specifically, the first drain terminal 32 is a portion where the first semiconductor element 1 is mounted and the first drain electrode 14 is electrically connected. The first drain terminal 32 is electrically connected to the first drain electrode 14 via a conductive connecting member such as solder. Therefore, the first semiconductor element 1 is mounted to the first drain terminal 32 by electrically connecting the first drain electrode 14 and the first drain terminal 32 via the conductive connecting member. In the present embodiment, solder is used as the conductive connecting member.

The drain terminal 32 has an opposite surface S11 that is opposite from the mounting surface, and the opposite surface S11 is exposed from the sealing resin 7. Therefore, in addition to the function as electrical wiring, the first drain terminal 32 also has a function as a heat sink for dissipating heat generated from the first semiconductor element 1. Therefore, the opposite surface S11 can be said to be a heat dissipation surface. For the mounting surface S12 and the opposite surface S11, for example, a flat surface can be adopted.

The first drain terminal 32 corresponds to a mounting portion. Further, the first drain terminal 32 can be said to be an island.

The first source terminal 31 is electrically connected to the first source electrode 12 via the first clip 51. In this way, the first source terminal 31 is not mounted with the first semiconductor element 1, and is electrically connected to the first semiconductor element 1 (first source electrode 12) via the first clip 51.

For example, the first clip 51 may contain a conductive material such as a metal material such as Cu, Fe or an alloy thereof as a main component. The first clip 51 includes a first element facing portion 51a facing the first source electrode 12, a first terminal facing portion 51b corresponding to the first source terminal 31, and a first connecting portion 51c that connects the first element facing portion 51a and the first terminal facing portion 51b. The first element facing portion 51a, the first terminal facing portion 51b, and the first connecting portion 51c are configured as an integral body.

The first element facing portion 51a is electrically connected to the first source electrode 12 via solder. Similarly, the first terminal facing portion 51b is electrically connected to the first source terminal 31 via solder. In this way, in the first semiconductor element 1, the first source electrode 12 and the first source terminal 31 are electrically connected via the first clip 51.

In the present embodiment, as an example, the first clip 51 which has a rectangular shape in the XY plane and has a thickness in the Z direction is adopted. Further, in the present embodiment, as an example, the first clip 51 in which the first connecting portion 51c faces an end portion of the first semiconductor element 1 and the first drain terminal 32 is adopted. Further, in the present embodiment, as shown in FIG. 2, the first clip 51 in which a thickness of the first connecting portion 51c is thinner than a thickness of the first element facing portion 51a is adopted.

As a result, the semiconductor device 100 can easily secure an insulation distance between the first drain terminal 32 and the first clip 51. Further, since a heat capacity on the first semiconductor element 1 can be increased as compared with a case where the first element facing portion 51a has the same thickness as the first connecting portion 51c, the heat dissipation of the semiconductor device 100 can be improved.

The first source terminal 31 corresponds to a non-mounting portion. Further, the first clip 51 corresponds to a bridge member.

The first signal terminal 33 is electrically connected to the first gate electrode 13 via the first wire 61.

Therefore, one of the first signal terminals 33 is electrically connected to the first gate electrode 13. Another one of the first signal terminals 33 is electrically connected to the pad, which is electrically connected to the temperature sensor or the current sensor, via the first wire 61.

In the first lead frame 30, a surface of the first source terminal 31 to which the first terminal facing portion 51b is connected and surfaces of the first signal terminals 33 to which the first wire 61 is connected are flush with the mounting surface S12 of the first drain terminal 32. That is, it can be said that the surface of the first source terminal 31 to which the first terminal facing portion 51b is connected and the surfaces of the first signal terminals 33 to which the first wire 61 is connected are formed on an XY plane passing through the mounting surface S12. Similarly, an opposite surface of the surface of the first source terminal 31 to which the first terminal facing portion 51b is connected and opposite surfaces of the surfaces of the first signal terminals 33 to which the first wire 61 is connected are flush with the opposite surface S11 of the first drain terminal 32.

Therefore, the opposite surface S11, the opposite surface of the surface of the first source terminal 31 to which the first terminal facing portion 51b is connected, and the opposite surfaces of the first signal terminals 33 to which the first wire 61 is connected can also be correctively referred to as the opposite surfaces S11.

Further, the second lead frame 40 has a mounting surface and an opposite surface in a manner similar to the first lead frame 30. Therefore, in the following, the portion described as the opposite surfaces S11 without particular indication indicates the opposite surfaces S11 of the first lead frame 30 and the second lead frame 40.

The second lead frame 40 has a second source terminal 41, a second drain terminal 42, and second signal terminals 43. The second lead frame 40 has a configuration similar to the first lead frame 30. Therefore, regarding the second lead frame 40, the description of the first lead frame 30 can be referred to.

The second clip 52 has a second element facing portion 52a, a second terminal facing portion 52b, and a second connecting portion 52c. The second clip 52 has a configuration similar to the first clip 51. Therefore, regarding the second clip 52, the description of the first clip 51 can be referred to.

The second wire 62 has a configuration similar to the first wire 61. Therefore, regarding the second wire 62, the description of the first wire 61 can be referred to.

The sealing resin 7 contains an electrically insulating resin and a filler having a higher thermal conductivity than the electrically insulating resin as constituent materials. That is, the sealing resin 7 has the filler embedded in the electrically insulating resin. As the electrically insulating resin, for example, an epoxy resin or the like can be adopted. On the other hand, as the filler, inorganic particles such as alumina can be adopted. The sealing resin 7 is formed, for example, by injection molding using a mold.

The sealing resin 7 integrally covers the semiconductor elements 1 and 2, the lead frames 30 and 40, the clips 51 and 52, and the wires 61 and 62. It can be said that the sealing resin 7 seals these components while being in contact with these components. Further, as described above, the semiconductor elements 1 and 2, the lead frames 30 and 40, the clips 51 and 52, and the wires 61 and 62 shown in FIG. 1 are sealed with the sealing resin 7. The sealing resin 7 has a rectangular shape on the XY plane.

As shown in FIG. 2, the sealing resin 7 has a first surface S1 and a second surface S2 opposite to the first surface S1. For the first surface S1 and the second surface S2, for example, flat surfaces can be adopted. Further, it can be said that the first surface S1 and the second surface S2 are formed along the XY plane.

As shown in FIG. 2, the sealing resin 7 covers the semiconductor elements 1 and 2, the lead frames 30 and 40, the clips 51 and 52, and the wires 61 and 62 in a state where the opposite surfaces S11 of the drain terminals 32 and 42 are exposed. In the lead frames 30 and 40, the entire area of the opposite surfaces S11 is exposed from the sealing resin 7. The first surface S1 is formed flush with the opposite surfaces S11.

The sealing resin 7 has an electrical insulating property and a thermal conductivity of 2.2 W or more. The thermal conductivity of the sealing resin 7 can be adjusted by adjusting the amount and material of the filler. Therefore, a surface resin portion 71, which will be described later, is made of a material having an electrical insulating property and a thermal conductivity of 2.2 W or more.

The sealing resin 7 covers the entire area of the clips 51 and 52 except for connection portions with the lead frames 30 and 40. Therefore, a part of the sealing resin 7 is also formed on the clips 51 and 52. That is, the sealing resin 7 includes the surface resin portion 71 formed on the clips 51 and 52. The semiconductor device 100 includes the surface resin portion 71 so that the clips 51 and 52 are not exposed from the sealing resin 7. The semiconductor device 100 is provided with the surface resin portion 71, so that the electrical insulation of the clips 51 and 52 can be ensured.

The surface resin portion 71 is formed on the surface of the clips 51 and 52 opposite to the semiconductor elements 1 and 2. Further, the surface resin portion 71 is formed on the entire surface of the clips 51 and 52 opposite to the semiconductor elements 1 and 2. Therefore, the second surface S2 and the opposite surfaces of the clips 51 and 52 that are opposite to the surfaces facing the semiconductor elements 1 and 2 are located at different positions in the Z direction. The surfaces of the clips 51 and 52 facing the semiconductor elements 1 and 2 are surfaces facing the source electrodes 12 and 22.

The surface resin portion 71 has a thickness at least one time the particle size of the filler. As a result, the sealing resin 7 can have the surface resin portion 71 containing the filler. That is, the sealing resin portion 7a can secure electrical insulation while maintaining the thermal conductivity of the filler. In other words, the sealing resin 7 can ensure heat dissipation and electrical insulation.

When the thickness of the surface resin portion 71 is about the particle size of the filler, it can be said that the sealing resin 7 has one resin layer formed on the clips 51 and 52. Further, it can be said that the sealing resin 7 includes the surface resin portion 71 having a thickness of one time or more the particle size of the filler.

Further, the surface layer portion 71 preferably has a thickness of 0.2 mm or more and 0.6 mm or less. The thickness of the surface resin portion 71 is the thickness in the Z direction. The thickness of the surface resin portion 71a can be adjusted by adjusting a size of a cavity of a mold.

It is conceivable that the thickness of the surface resin portion 71 varies depending on a tolerance of a shape and a thickness the clips 51 and 52, a tolerance of solder formed on both sides of the semiconductor elements 1 and 2, and a tolerance of a plate thickness of the lead frames 30 and 40. The inventor examined the thickness of the surface resin portion 71 in consideration of these tolerances and the process capability when molding the sealing resin 7. Then, the inventors could obtain the result that the thickness of the surface resin portion 71 is preferably 0.4 mm±0.2 mm. That is, in the semiconductor device 100, by setting the thickness of the surface resin portion 71 to 0.4 mm±0.2 mm, it is easy to form the surface resin portion 71 containing the filler, and heat dissipation and electrical insulation can be ensured.

The present embodiment adopts the lead frames 30 and 40 having recessed portions recessed from the opposite surface S11, as shown in FIG. 2. Therefore, the sealing resin 7 is also formed between the lead frames 30 and 40 and the first surface S1. However, the present disclosure is not only limited to the above example.

As described above, since the semiconductor device 100 is covered with the sealing resin 7 without exposing the clips 51 and 52, electrical insulation can be ensured. Further, since the sealing resin 7 in the semiconductor device 100 has a thermal conductivity of 2.2 W or more, heat dissipation can be ensured. That is, the semiconductor device 100 can secure electric insulation and heat dissipation without providing an electrically insulating heat dissipating gel or the like on the clips 51 and 52. In other words, the semiconductor device 100 can secure electric insulation and heat dissipation without additional component. Therefore, the semiconductor device 100 does not need to guarantee electric insulation and heat dissipation on a user side such as a delivery destination.

Figure 3:
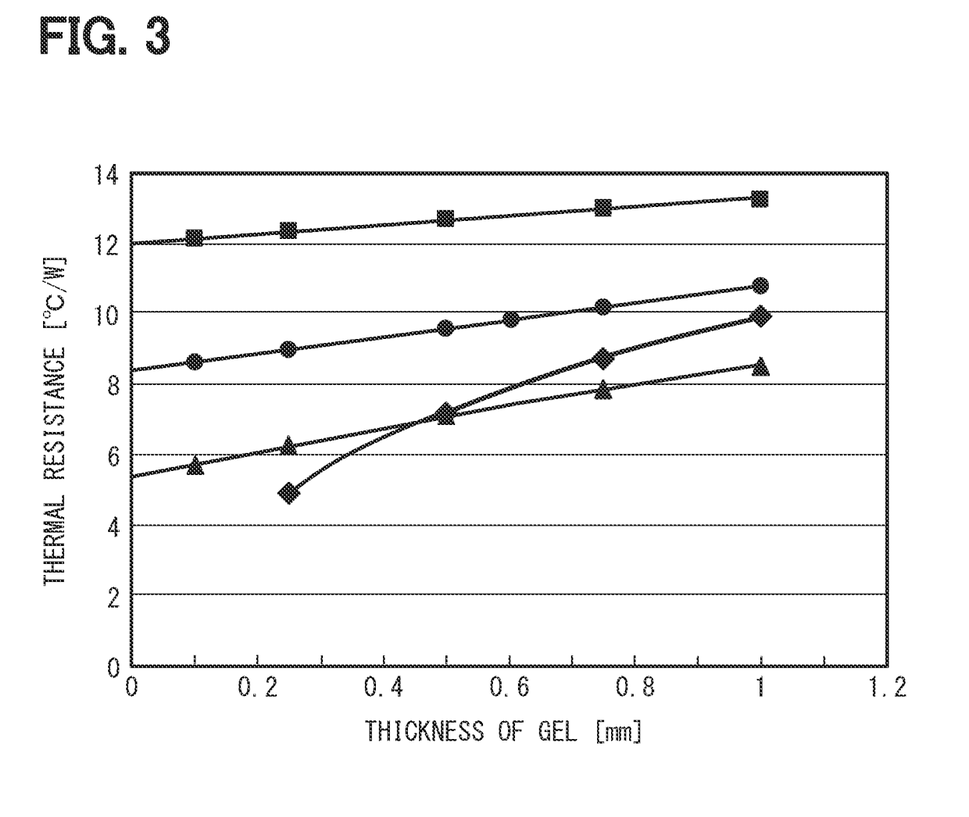
FIG. 3 is a graph showing heat dissipation characteristics of the semiconductor device according to the embodiment and a semiconductor device according to a comparative example.

Further, as shown in FIG. 3, the heat dissipation characteristics of the semiconductor device 100 and a semiconductor device of a comparative example (hereinafter, simply comparative example) were compared by simulation. In FIG. 3, the horizontal axis represents the thickness of the gel [mm], and the vertical axis represents the thermal resistance [° C./W]. In this simulation, the temperature of the upper surface of the gel was fixed. The gel is a heat dissipation gel having electric insulation.

The comparative example has a structure in which a semiconductor device having a double-sided heat dissipation structure is insulated with gel. That is, in the comparative example, an electrically insulating heat dissipating gel having a thermal conductivity of 3 W is provided on the heat sink.

Further, the thermal resistance indicates the thermal resistance in the surface resin portion 71 and the gel. That is, the thermal resistance of the semiconductor device 100 indicates the thermal resistance of the surface resin portion 71 provided on the clips 51 and 52. In a case where the gel is provided on the surface resin portion 71, the thermal resistance of the semiconductor device 100 indicates the thermal resistance between the surface resin portion 71 and the gel.

The graph shown by diamond points is a graph showing the heat dissipation characteristics of the comparative example. The graph shown by triangular points is a graph showing the heat dissipation characteristics of the semiconductor device 100 in a case where the thermal conductivity of the sealing resin 7 is 3 W and the thickness of the surface resin portion 71 is 0.5 mm. The graph shown by circular points is a graph showing the heat dissipation characteristics of the semiconductor device 100 in a case where the thermal conductivity of the sealing resin 7 is 2.2 W and the thickness of the surface resin portion 71 is 0.6 mm. The graph shown by square points is a graph showing the heat dissipation characteristics of the semiconductor device 100 in a case where the thermal conductivity of the sealing resin 7 is 1 W and the thickness of the surface resin portion 71 is 0.5 mm.

The semiconductor device 100 of the present embodiment is not provided with a gel. Therefore, the thermal resistance of the semiconductor device 100 is a value at a gel thickness of 0 mm. Further, in the semiconductor device 100, as preferable examples as described above, the thermal conductivity of the sealing resin 7 is set to 2.2 W or more.

Therefore, it can be seen that the thermal resistance of the semiconductor device 100 is smaller than about 8° C./W, as shown in the graph of the circular points and triangular points in FIG. 3. Therefore, it can be seen that the semiconductor device 100 can obtain a thermal resistance equal to or lower than that of the comparative example when the thermal conductivity of the sealing resin 7 is set to 2.2 W or more. That is, the semiconductor device 100 can obtain heat dissipation equal to or higher than that of the comparative example when the thermal conductivity of the sealing resin 7 is set to 2.2 W or more. Further, the semiconductor device 100 can obtain heat dissipation equal to or higher than that of the comparative example when the thermal conductivity of the sealing resin 7 is set to 2.2 W or more, and the thickness of the surface resin portion 71 is set to 0.6 mm or less.

The preferred embodiment of the present disclosure has been described above. However, the present disclosure is not limited to the above embodiment. Various modifications may be made without departing from the scope and spirit of the present disclosure. First and second modifications will be described as the other embodiments below. The above-described embodiment and first and second modifications can be carried out individually, but can also be carried out in combination as appropriate. The present disclosure can be performed by various combinations without being limited to the combination described in the embodiments.

First Modification

Figure 4:
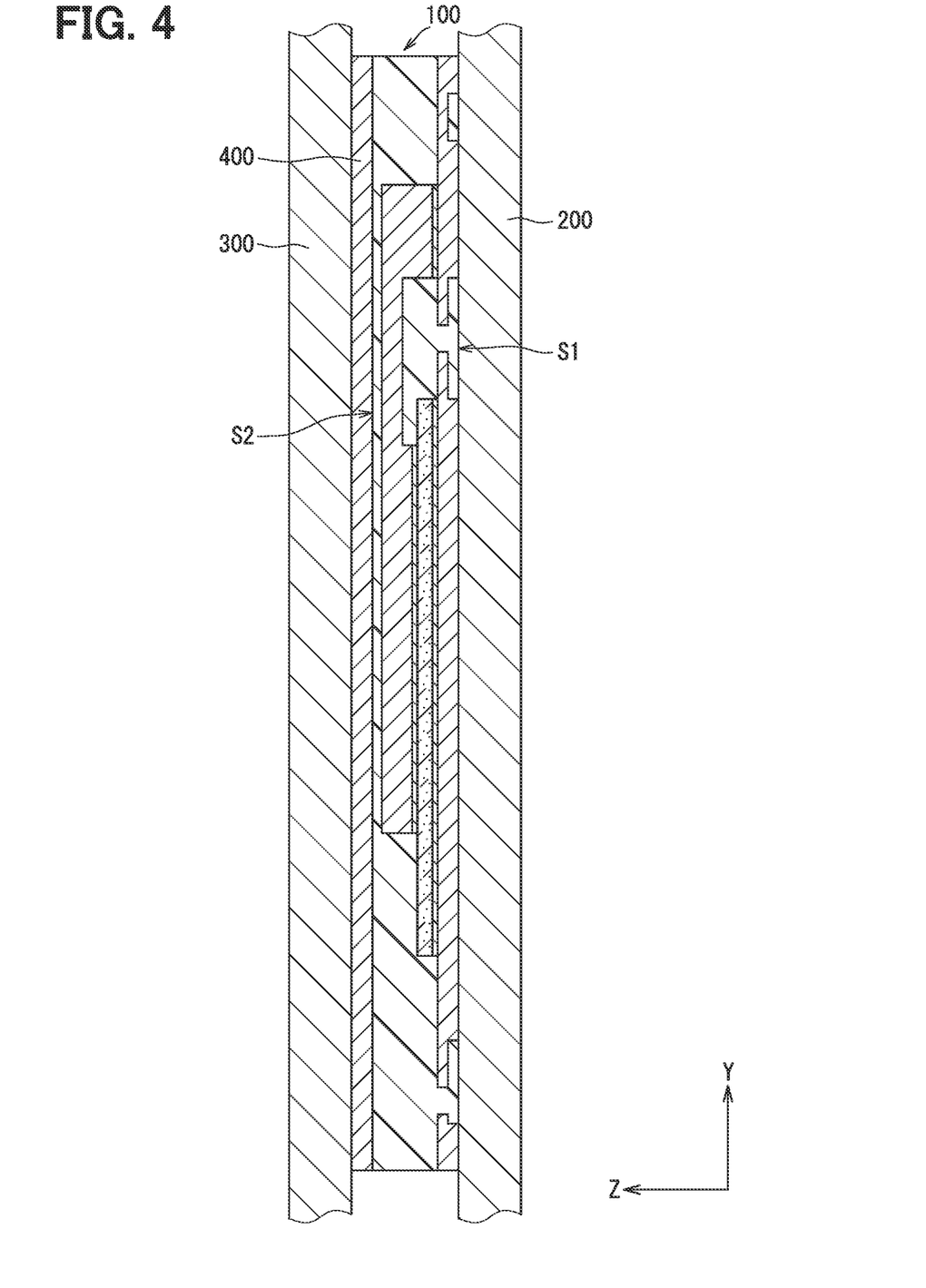
FIG. 4 is a cross-sectional view showing a schematic configuration of a semiconductor device according to a first modification.

As shown in FIG. 4, the semiconductor device 100 may be mounted on a printed circuit board 200 and attached to a motor 300 via a gel 400. In the printed circuit board 200, wiring and pads made of conductive members are formed on a substrate made of an electrically insulating resin or the like. In the semiconductor device 100, the first source terminal 31, the first drain terminal 32, and the first signal terminals 33 are electrically connected to a pad of the printed board 200 via a conductive member such as solder.

The motor 300 includes, for example, a rotor and a stator, as well as a housing for accommodating these components. The semiconductor device 100 is attached to the housing of the motor 300, for example.

As the motor 300, a motor driven by the semiconductor elements 1 and 2 of the semiconductor device 100 can be adopted. In this case, the semiconductor elements 1 and 2 are switching elements of an inverter that drives the motor 300. The present embodiment adopts the motor 300 as an example of an object to which the semiconductor device 100 is attached. However, the present disclosure is not only limited to the above example. The semiconductor device 100 may be attached to a load (attached object) driven by the semiconductor elements 1 and 2 as driving elements.

The gel 400 is provided on the second surface S2. As the gel 400, the gel as described above can be adopted. However, the semiconductor device 100 has electric insulation by itself. Therefore, the semiconductor device 100 does not need to secure electric insulation with the motor 300 by the gel 400. Therefore, the gel 400 can be thinner than the gel used in the comparative example.

The semiconductor device 100 can have effects similar to the effects of the above embodiment. The semiconductor device 100 may include the printed circuit board 200, the motor 300, and the gel 400.

Second Modification

Figure 5:
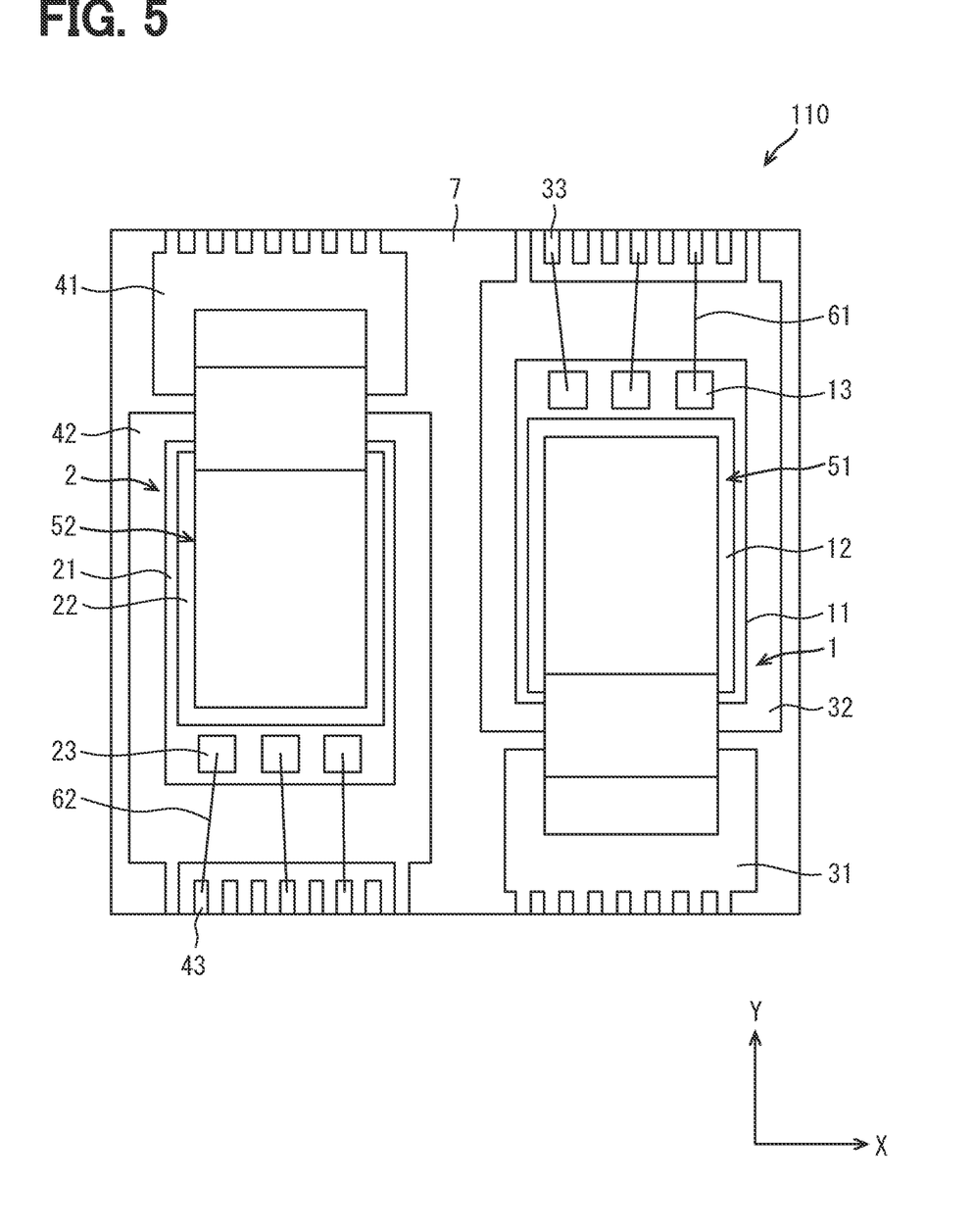
FIG. 5 is a plan view showing a schematic configuration of a semiconductor device according to a second modification.

As shown in FIG. 5, a semiconductor device 110 according to the second modification differs from the semiconductor device 100 in the arrangement of the semiconductor elements 1 and 2. In the semiconductor device 110, the first semiconductor element 1 and the second semiconductor element 2 are alternately arranged. That is, in the semiconductor device 110, the second source terminal 41 is arranged adjacent to the first signal terminals 33, and the second signal terminals 43 are arranged adjacent to the first source terminal 31. The semiconductor device 110 can have effects similar to those of the semiconductor device 100.

What is claimed is:

1. A semiconductor device comprising:
   a semiconductor element having a first surface and a second surface opposite from each other, and having a first electrode exposed on the first surface and a second electrode disposed on the second surface;
   a lead frame including a mounting portion and a non-mounting portion divided from the mounting portion, the mounting portion having a mounting surface to which the semiconductor element is mounted and the first electrode is electrically connected, and an opposite surface opposite from the mounting surface;
   a bridge member having conductivity and electrically connecting the second electrode and the non-mounting portion; and
   a sealing resin having electric insulation, having a thermal conductivity of 2.2 W or more, and covering the semiconductor element, the lead frame, and the bridge member in a state where the opposite surface of the mounting portion is exposed from the sealing resin, wherein
   the sealing resin includes, as constituent materials, an electrically insulating resin and a filler having a higher thermal conductivity than the electrically insulating resin, and has a surface resin portion disposed on the bridge member, and
   the surface resin portion has a thickness of 0.2 mm or more and 0.6 mm or less.

* * * * *